United States Patent [19]
Negoro

[11] Patent Number: 5,338,972
[45] Date of Patent: Aug. 16, 1994

[54] LEAD FRAME WITH DEFORMABLE BUFFER PORTIONS

[75] Inventor: Atsuhito Negoro, Kyoto, Japan

[73] Assignee: Rohm Co., Ltd., Kyoto, Japan

[21] Appl. No.: 52,554

[22] Filed: Apr. 23, 1993

[30] Foreign Application Priority Data

Aug. 10, 1992 [JP] Japan .................. 4-235260

[51] Int. Cl.⁵ .............. H01L 23/48; H01L 29/46; H01L 29/62; H01L 29/64
[52] U.S. Cl. .................... 257/666; 257/669
[58] Field of Search ............ 257/666, 667, 669, 670, 257/674

[56] References Cited

U.S. PATENT DOCUMENTS 4,870,474  9/1989  Karashima .............. 257/669
5,223,738  6/1993  Okada .................. 257/668

FOREIGN PATENT DOCUMENTS 3-276748  12/1991  Japan .................. 257/669

Primary Examiner—William Mintel
Assistant Examiner—S. V. Clark
Attorney, Agent, or Firm—Brumbaugh, Graves, Donohue & Raymond

[57] ABSTRACT

A lead frame has a central portion and groups of lead terminals distributed around the four peripheral sides of the central portion, along with main buffer portions coupling the lead terminals together in corresponding groups to prevent warping of the lead frame as a result of contraction of an injection-molded resin body during hardening. In addition, slits are provided outside the buffer portions which extend farther at one end of the slits than the corresponding side of the resin body, and auxiliary buffer portions located at both ends of the slits support the main buffer portions.

5 Claims, 2 Drawing Sheets

LEAD FRAME WITH DEFORMABLE BUFFER PORTIONS

BACKGROUND OF THE INVENTION

This invention relates to lead frames for rectangular flat packages having lead terminals which extend outwardly through the four peripheral sides of a resin body.

In a conventional lead frame 1 for a rectangular flat package shown in FIG. 3, the lead frame includes a central portion 3 on which a semiconductor element 2 is to be mounted and a plurality of lead terminals 4 distributed around the central portion 3 and extending toward the four peripheral sides of the frame. The inner ends of the lead terminals 4 terminate adjacent to the central portion 3 which is supported by two central portion leads 5. The lead terminals 4 and the central portion leads 5 are coupled together partway along their length by dam bars 6 and they are divided into four groups corresponding to the four peripheral sides of the frame 1. The lead terminals 4 and the central portion leads 5 are also joined at their outer ends to peripheral buffer portions 7 separated from the rest of the frame by slits 8. Two side rails 10 extend along the edges of the frame 1 and have guide holes 9 at preselected intervals so that the guide holes can be used, for example, to position the frame. In the arrangement shown in FIG. 3, the lead frame 1 is coupled to adjacent lead frames in a strip by section bars 11.

A rectangular flat package is made from a lead frame 1 as described hereinafter. The semiconductor element 2 is first bonded onto the central portion 3 of the frame 1 and the terminals of the element 2 are then connected by wires to the lead terminals 4 of the frame. An epoxy resin or similar material is molded, for example, by transfer molding, around the lead frame 1 so as to make a resin body 12 in an oblong area inside the dam bars 6 as shown by a dot-dash outline in FIG. 3. The semiconductor element 2 is thus encapsulated by the resin body 12. Thereafter, the dam bars 6 are punched out and the lead terminals 4 are cut off and bent.

When the epoxy resin or similar material thermally hardens during molding to make the resin body 12, the molded material contracts. Since the lead frame 1 has a lower coefficient of thermal expansion than the molded material and is very thin, the frame is likely to undergo warp or deformation as the resin body contracts. However, because of the presence of the slits 8, the buffer portions 7 are deformed to allow the resin body 12 to contract in the longitudinal and transverse directions without causing the lead frame 1 to undergo much warp or deformation as a whole.

Nevertheless, the conventional lead frame 1 has a problem as described hereinafter. The resin body 12 of the rectangular flat package contracts toward its center in all directions, but the deformation of the buffer portions 7 of the lead frame does not prevent the contraction of the resin body in the diagonal directions from causing the lead frame to undergo warp or deformation. For that reason, the frame 1 cannot smoothly be conveyed during the punching and bending operation after the manufacturing of the resin body 12.

SUMMARY OF THE INVENTION

Accordingly, it is an object of the present invention to provide a lead frame which overcomes the disadvantages of the prior art.

Another object of the invention is to provide a lead frame which is prevented from undergoing warp or deformation in any direction when a resin body contracts.

These and other objects of the invention are attained by providing a lead frame which includes groups of lead terminals arranged to extend outwardly through the four peripheral sides of the resin body on the frame and main buffer portions coupling the lead terminals together at the outer ends thereof in each of the groups, respectively, along with slits extending outside the buffer portions with each of the slits extending farther at at least one end thereof than the corresponding side of the resin body. In addition, the main buffer portions are coupled at both ends to section bars or side rails by auxiliary buffer portions located at both ends of the slits and arranged to support the main buffer portions.

In a lead frame arranged in accordance with the present invention, the main buffer portions are deformed during contraction of the resin body so as to enable the frame to permit the contraction primarily in the longitudinal and transverse directions of the resin body, and the auxiliary buffer portions located at both ends of the slits and supporting the main buffer portions are also deformed during the contraction so as to enable the frame to permit contraction in the diagonal directions of the resin body. For that reason, the lead frame is inhibited from undergoing any warp or deformation as a whole due to the contraction of the molded portion.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENT

Figure 1:
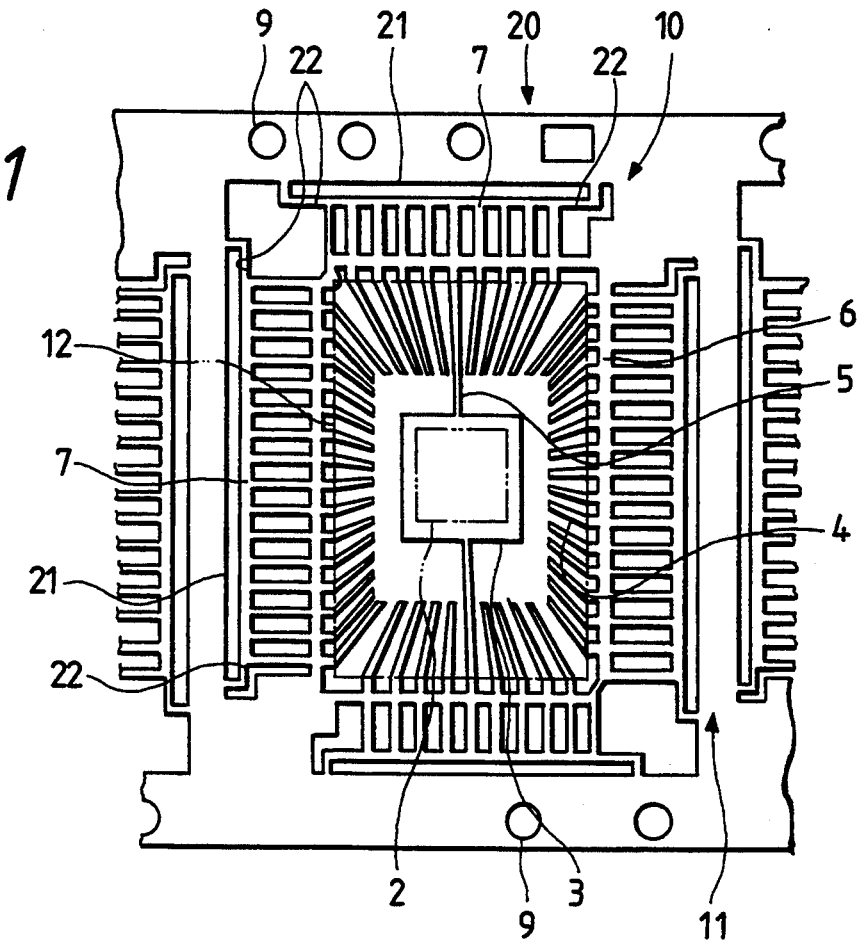
FIG. 1 is a plan view showing a representative embodiment of a lead frame arranged in accordance with the present invention.

In the typical embodiment of the invention shown in FIG. 1, a lead frame 20 includes a central portion 3 on which a semiconductor element 2 is to be mounted and lead terminals 4 distributed around the four peripheral sides of the central portion. In addition, central portion leads 5 support the central portion and dam bars 6 connect all of the lead terminals 4 and the central portion support leads 5. The lead terminals are connected to main buffer portions 7 which join the lead terminals 4 and the central portion leads 5 together at the outer ends thereof and side rails 10 having guide holes 9 extend along the edges of the lead frame while section bars 11 separate the lead frame 20 from adjacent lead frames in the strip and L-shaped auxiliary buffer portions 22 are provided at the ends of the main buffer portions 7. The lead terminals 4 are coupled to the central portion leads 5 by the dam bars 6 and the main buffer portions 7. The guide holes 9 are provided at prescribed intervals in the side rails 10.

The lead frame 20 also has slits 21 disposed outside the main buffer portions 7 and, as shown in FIG. 1, each of the slits 21 extends farther at one end than the corresponding side of the resin body 12 of a rectangular flat package which incorporates the lead frame 20 in the same manner as the conventional rectangular flat package described above. Since a gate, which is not shown in the drawings, for injecting an epoxy resin into a cavity between molding dies to manufacture the resin body 12 must be provided at a location corresponding to a corner of the resin body, the slits 21 cannot extend farther than the corresponding side of the resin body 12 at their other ends. However, each of the slits 21 should preferably extend farther at both ends than the corresponding side of the resin body 12 in order to more effectively prevent the lead frame 20 from undergoing deformation or warp as a whole. Each of the four groups of the lead terminals 4 extending outward from the four sides of the central portion 3 are coupled together at the outer ends of the terminals by the corresponding main buffer portion 7 extending along the slit 21. The main buffer portions 7 are coupled at both ends thereof to the side rails 10 or to the section bars 11 by the auxiliary buffer portions 22 extending at both ends of the slits 21 and supporting the main buffer portions.

Figure 2:
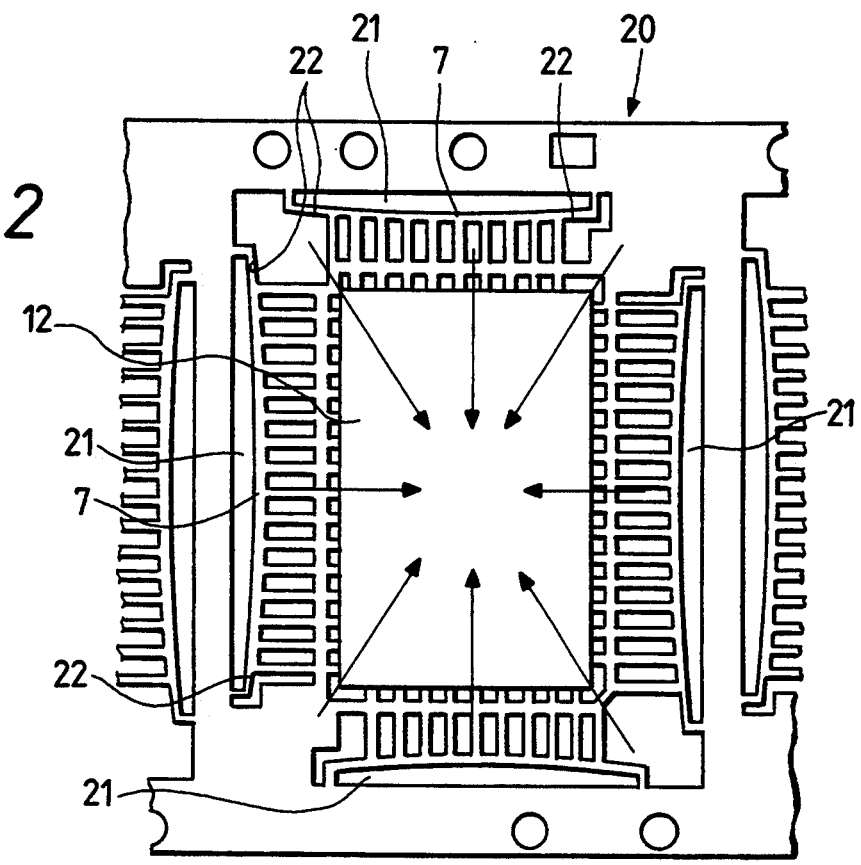
FIG. 2 is a plan view of the lead frame shown in FIG. 1 illustrating the deformation thereof at the time of molding.
Figure 3:
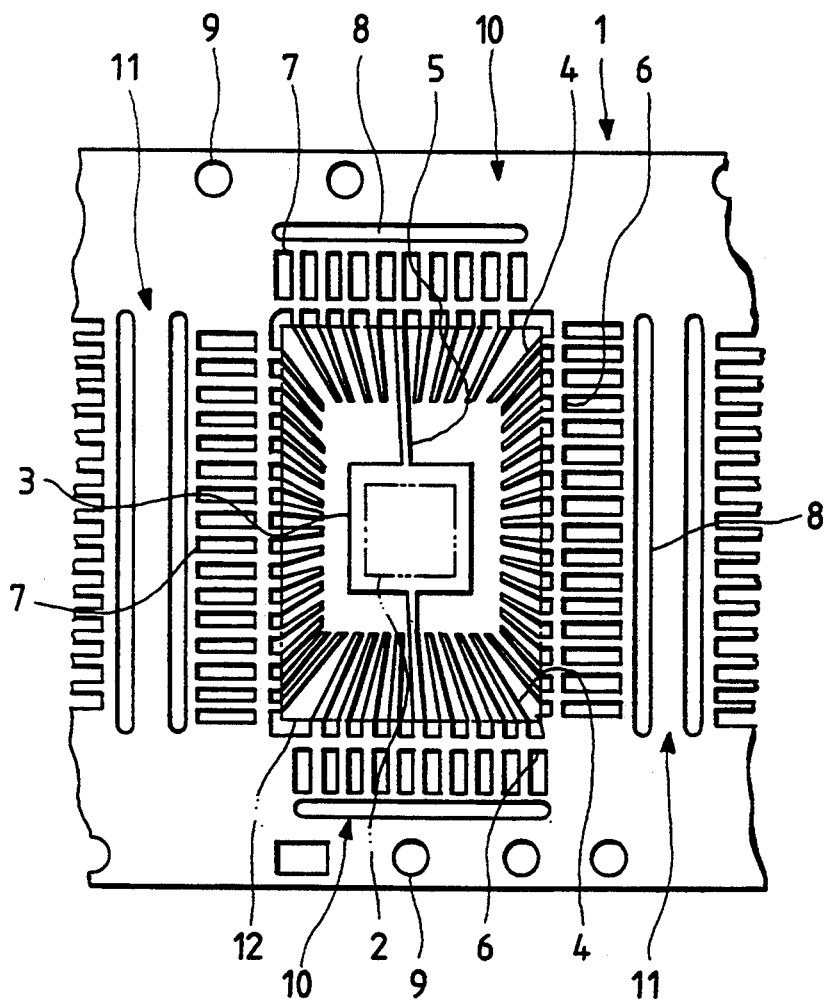
FIG. 3 is a plan view showing a conventional lead frame.

When the epoxy resin thermally hardens during the molding of the resin body 12 during the molding process, the resin contracts in all directions as shown by the arrows in FIG. 2. At that time, the main buffer portions 7 extending along the slits 21 are deformed to enable the lead frame 20 to permit the contraction of the molded portion 12 chiefly in the longitudinal and transverse directions thereof, and the auxiliary buffer portions 22 extending at both ends of the slits are deformed to enable the frame to permit the contraction of the resin body in the diagonal directions thereof. For that reason, the lead frame 20 is prevented from being deformed or warped as a whole due to contraction of the resin body.

Thus, the lead frame provided in accordance with the present invention has slits along main buffer portions coupling lead terminals together in groups which extend farther at least at one end of the slit than the corresponding side of the resin body of the rectangular flat package, and has main buffer portions which are coupled at both ends to section bars or side rails by auxiliary buffer portions located at both ends of the slits to support the main buffer portions. For that reason, when the resin body contracts during the thermal hardening of an epoxy resin which has been injected to make the body, the main and auxiliary buffer portions are both deformed to enable the lead frame to permit contraction of the resin body in the longitudinal, transverse and diagonal directions so that the frame is prevented from undergoing warping or deformation as a whole. As a result, the lead frame can be easily conveyed during cut-off of dam bars and bending of the lead terminals after the molding has been completed.

Although the invention has been described herein with reference to a specific embodiment, many modifications and variations therein will readily occur to those skilled in the art. Accordingly, all such variations and modifications are included within the intended scope of the invention.

What is claimed is:

1. A lead frame comprising a frame formed with groups of lead terminals arranged to extend outwardly through the peripheral sides of a resin body in which the frame is embedded, a plurality of main buffer portions formed in the frame coupling the terminals together in groups at the outer ends thereof, a plurality of slits formed outside of the buffer portions, each of which extends farther at at least one end thereof than the corresponding side of said resin body, and an auxiliary buffer portion having two perpendicular legs connecting each end of each main buffer portion and an adjacent section bar or side rail of the frame in which one leg of the auxiliary buffer portion constitutes a longitudinal extension of a side of the corresponding main buffer portion defining one side of an adjacent slit and the other leg of the auxiliary buffer portion extends perpendicularly thereto to join the main buffer portion directly to the adjacent section bar or side rail and to define one end of an adjacent slit, thereby supporting the main buffer portion while allowing motion of the main buffer portion toward or away from the adjacent section bar or side rail and inhibiting motion of the main buffer portion parallel thereto.

2. A lead frame according to claim 1, in which said main buffer portions are deformed during contraction of said resin body so as to enable the frame to permit the contraction primarily in the longitudinal and transverse directions of said resin body, and said auxiliary buffer portions being located at both ends of said slits and supporting said main buffer portions are also deformed during the contraction so as to enable said frame to permit contraction in the diagonal direction of said resin body.

3. A lead frame comprising a frame formed with groups of lead terminals arranged to extend outwardly through the peripheral sides of a resin body in which the frame is embedded, a plurality of main buffer portions formed in the frame coupling the terminals together in groups at the outer ends thereof, a plurality of slits formed outside of the buffer portions, each of which extends farther at at least one end thereof than the corresponding side of said resin body, and an L-shaped auxiliary buffer portion between each end of each main buffer portion and an adjacent section bar or side rail of the frame so that both ends of the corresponding groups of lead terminals are supported by L-shaped auxiliary buffer portions.

4. A lead frame according to claim 3, in which said main buffer portions are deformed during contraction of said resin body so as to enable the frame to permit the contraction primarily in the longitudinal and transverse directions of said resin body, and said L-shaped auxiliary buffer portions being located at both ends of said slits and supporting said main buffer portions are also deformed during the contraction so as to enable said frame to permit contraction in the diagonal direction of said resin body.

5. A lead frame according to claim 3 wherein all of the groups of lead terminals are supported at both ends by L-shaped auxiliary buffer portions.

* * * * *